(12) United States Patent
Kerrigan et al.

(10) Patent No.: US 6,344,736 B1
(45) Date of Patent: Feb. 5, 2002

(54) SELF-ALIGNING INTERFACE APPARATUS FOR USE IN TESTING ELECTRICAL

(75) Inventors: James J. Kerrigan, Andover; Frank Kendall Porter, Jr., Billerica, both of MA (US)

(73) Assignee: Tensolite Company, Andover, MA (US)

( * ) Notice: Subject to any disclaimer, the term of this patent is extended or adjusted under 35 U.S.C. 154(b) by 0 days.

(21) Appl. No.: 09/359,092

(22) Filed: Jul. 22, 1999

(51) Int. Cl.[7] .......................... G01R 1/04; G01R 31/02; H01R 9/05
(52) U.S. Cl. .................... 324/158.1; 324/758; 439/578
(58) Field of Search .............................. 324/158.1, 758; 439/320, 578, 580

(56) References Cited

U.S. PATENT DOCUMENTS

| | | | | |
|---|---|---|---|---|
| 3,094,364 A | * | 6/1963 | Lingg | 439/247 |
| 4,227,765 A | * | 10/1980 | Neumann et al. | 439/578 |
| 4,426,127 A | * | 1/1984 | Kubota | 439/578 |
| 5,543,726 A | * | 8/1996 | Boyette, Jr. et al. | 324/758 |
| 5,546,405 A | * | 8/1996 | Golla | 324/754 |
| 5,746,617 A | * | 5/1998 | Porter, Jr. et al. | 439/578 |
| 5,903,162 A | * | 5/1999 | Cole et al. | 324/758 |
| 6,010,349 A | * | 1/2000 | Porter, Jr. | 439/578 |

* cited by examiner

Primary Examiner—Glenn W. Brown
Assistant Examiner—Jermele M. Hollington
(74) Attorney, Agent, or Firm—Herbert L. Bello

(57) ABSTRACT

An interface apparatus having a plurality of self-aligning coaxial connectors for substantially simultaneous interconnection with a plurality of connectors on a unit under test includes a base member, a first interface and a second interface. The first and second interfaces are spaced apart to receive the unit under test. At least one of the first and second interfaces is slidably movable on the base member for movement into engagement with the unit under test that is positioned between the interfaces. At least one of the first and second interfaces has a plurality of self-aligning coaxial connectors that are positioned to interconnect with the plurality of connectors on the unit under test. An urging means is provided for moving the interfaces so that the self-aligning coaxial connectors are moved into mating engagement with the plurality of connectors on the unit under test that is positioned between the interfaces. The self-aligning connectors are provided with cables that are configured to be connected to an analyzer or test unit and a supply for testing the unit under test.

17 Claims, 7 Drawing Sheets

SELF-ALIGNING INTERFACE APPARATUS FOR USE IN TESTING ELECTRICAL

BACKGROUND OF THE INVENTION

1. Field of the Invention

The invention relates to interface apparatus and, more particularly, is directed toward self-aligning interface apparatus used in testing electrical devices, particularly, microwave devices.

2. Description of the Prior Art

The electronic testing of microwave equipment, which includes use of multiple industry standard and special purpose microwave interfaces such as Type N, Type F, SMA TNC and BNC, generally requires manually attaching each of the individual test cables to each of these interfaces. Accordingly, such procedures are tedious and time consuming.

Although numerous devices have been developed that permit quick connection of the individual cables to interfaces, such devices suffer from the limitation and disadvantage and that each test cable must be individually connected to the interface. According, such devices have met limited success.

Self-aligning coaxial cable connectors have been designed to permit "blind" interconnection of coaxial cables with mating connectors that are mounted to stationary housings. U.S. Pat. No. 5,746,617 is an example of such a self-aligning coaxial connector.

SUMMARY OF THE INVENTION

It is an object of the present invention to provide a self-aligning interface apparatus used in testing electrical devices, particularly, microwave devices, that does not suffer from the heretofore mentioned limitation and disadvantage of prior art systems.

It is another object of the invention to provide an efficient interface apparatus used in testing electrical devices, particularly microwave devices, that permits substantially simultaneous interconnection of multiple connectors on a unit under test with a test apparatus.

It is a further object of the present invention to provide an interface apparatus having a plurality of self-aligning coaxial connectors for substantially simultaneous interconnection with a plurality of connectors on a unit under test.

According to an embodiment of this invention, an interface apparatus having a plurality of self-aligning coaxial connectors for substantially simultaneous interconnection with a plurality of connectors on a unit under test includes a base member, a first interface and a second interface. The first and second interfaces are spaced apart to receive the unit under test. At least one of the first and second interfaces is slidably movable on the base member for movement into engagement and disengagement with the unit under test that is positioned between the interfaces. At least one of the first and second interfaces has a plurality of self-aligning coaxial connectors that are positioned to interconnect with the plurality of connectors on the unit under test. An urging means is provided for moving the interfaces toward the unit under test for mating engagement of the self-aligning coaxial connectors and the connectors of the unit under test. In operation, the interfaces are spaced apart and a unit under test is placed there between. As the urging means moves one or both of the interfaces into engagement with the unit under test, the self-aligning coaxial connectors mounted to one or both interfaces substantially simultaneously interconnect with the plurality of connectors on the unit under test. Cables connected to the self-aligning connectors are configured to be connected to an analyzer and supply testing the unit under test. Upon completion of the testing, the urging means moves the interfaces apart for disengagement of the self-aligning connectors and the connectors on the unit under test. The interface apparatus is now ready to receive another unit to be tested.

The above and other objects, features and advantages of this invention will be more readily apparent from a reading of the following detailed description of various aspects of the invention taken in conjunction with the accompanying drawings.

The invention accordingly comprises the steps and apparatus embodying features of construction, combinations of elements and arrangements of parts adapted to affect such steps, as exemplified in the following detailed disclosure, the scope of the invention being indicated in the accompanying claims.

BRIEF DESCRIPTION OF THE DRAWINGS

A fuller understanding of the nature and objects of the present invention will become apparent upon consideration of the following detailed description taken in connection with the accompanying drawings in which.

DETAILED DESCRIPTION OF THE PREFERRED EMBODIMENTS

Figure 1:
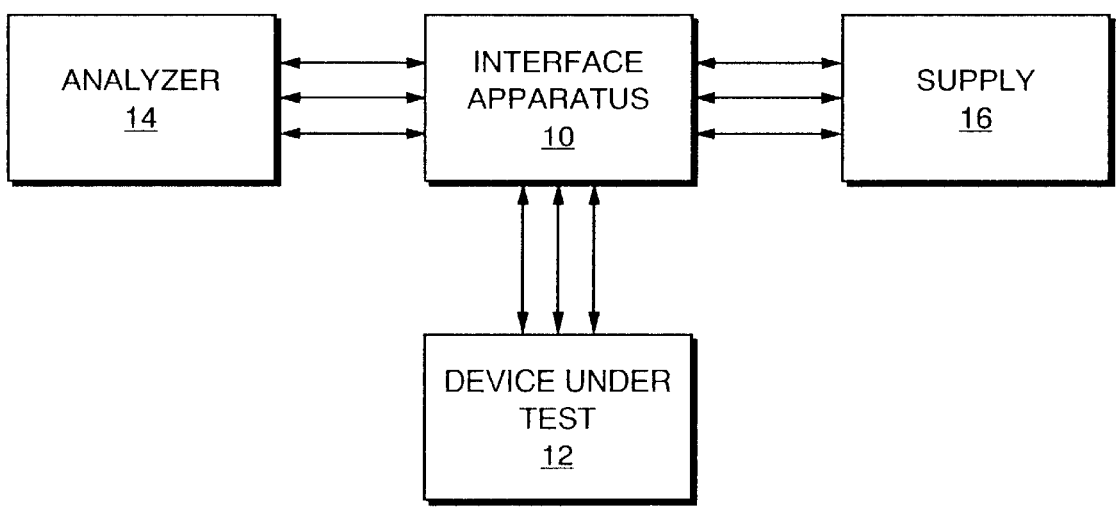
FIG. 1 is a schematic diagram of a test system employing the present invention.
Figure 2:
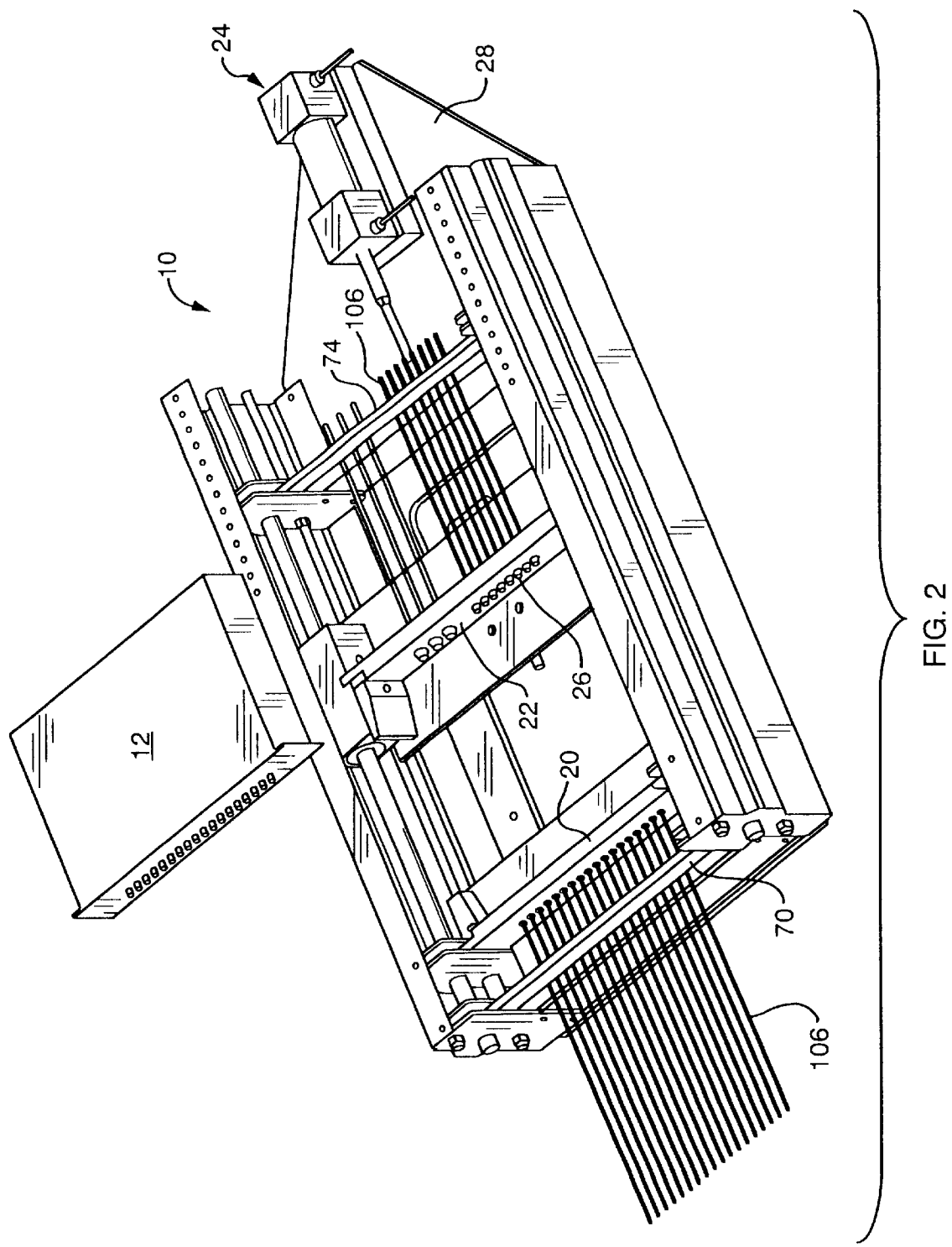
FIG. 2 is a perspective view of an interface apparatus embodying the present invention having a plurality of self-aligning coaxial connectors, the interface apparatus being in an open position for receiving a device to be tested.
Figure 3:
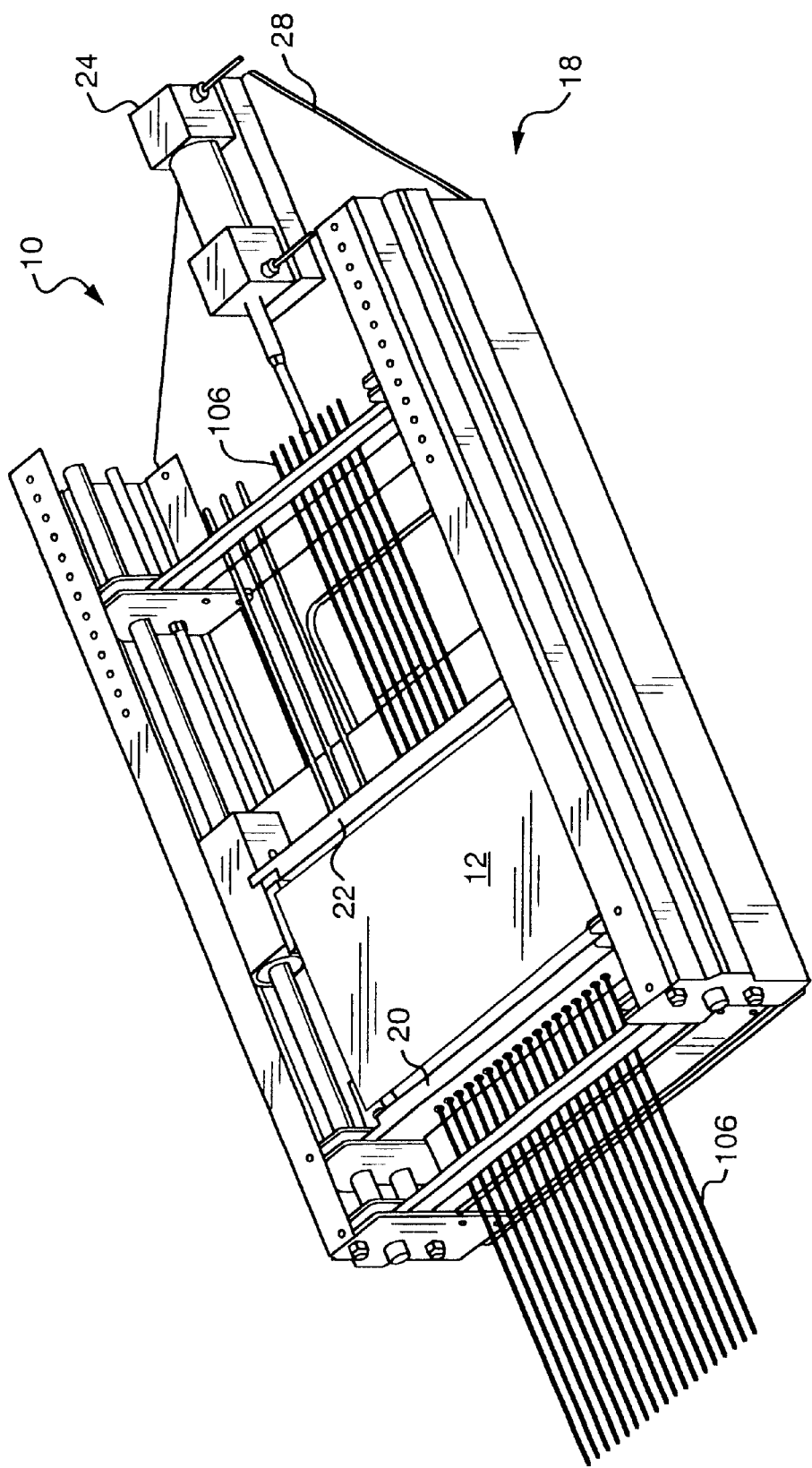
FIG. 3 is a perspective view of the interface apparatus of FIG. 2 in a closed position with the self-aligning coaxial connectors in engagement with a device to be tested.
Figure 4:
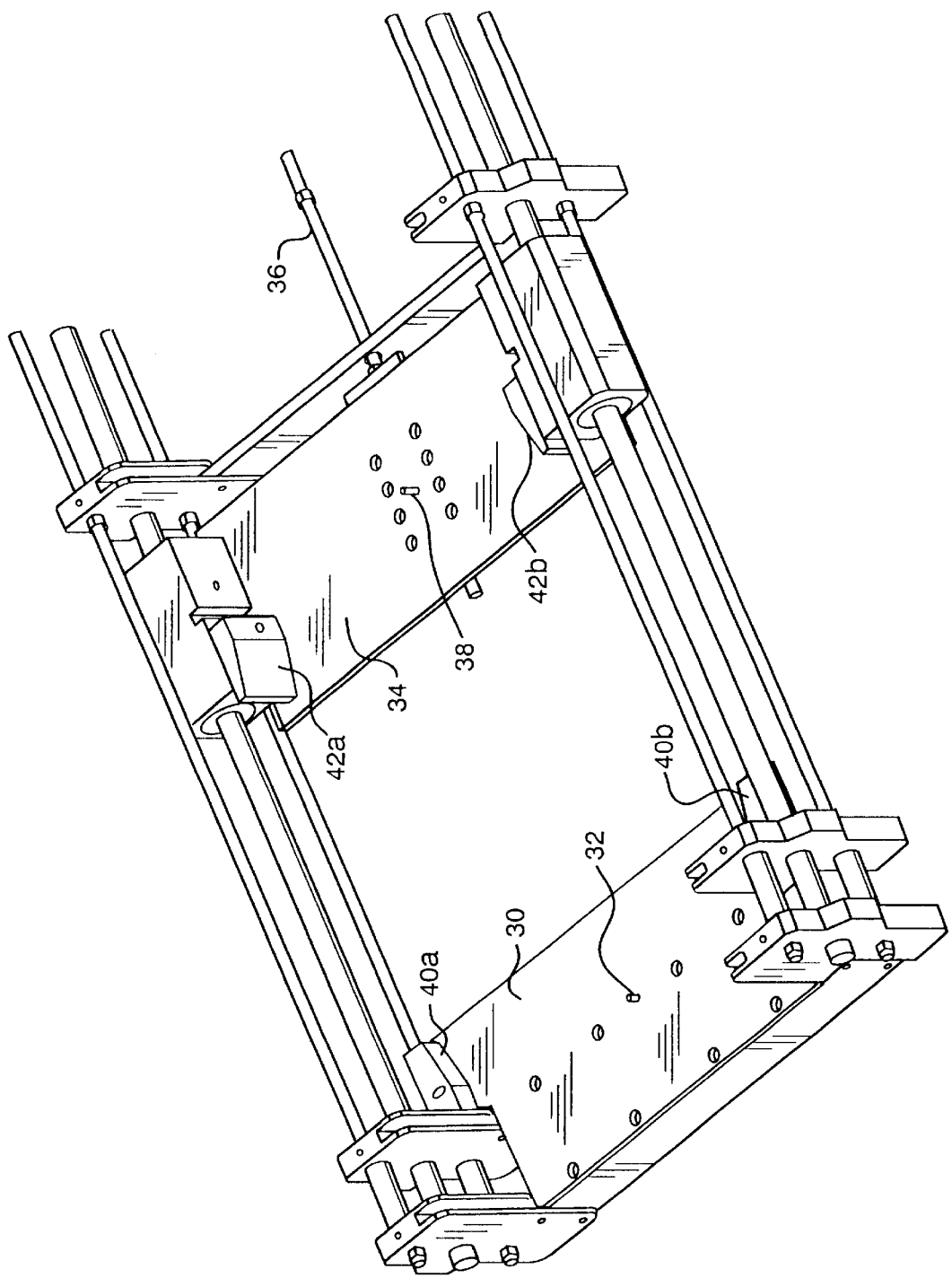
FIG. 4 is a top view showing details of the self-aligning coaxial connectors of FIG. 2.
Figure 5:
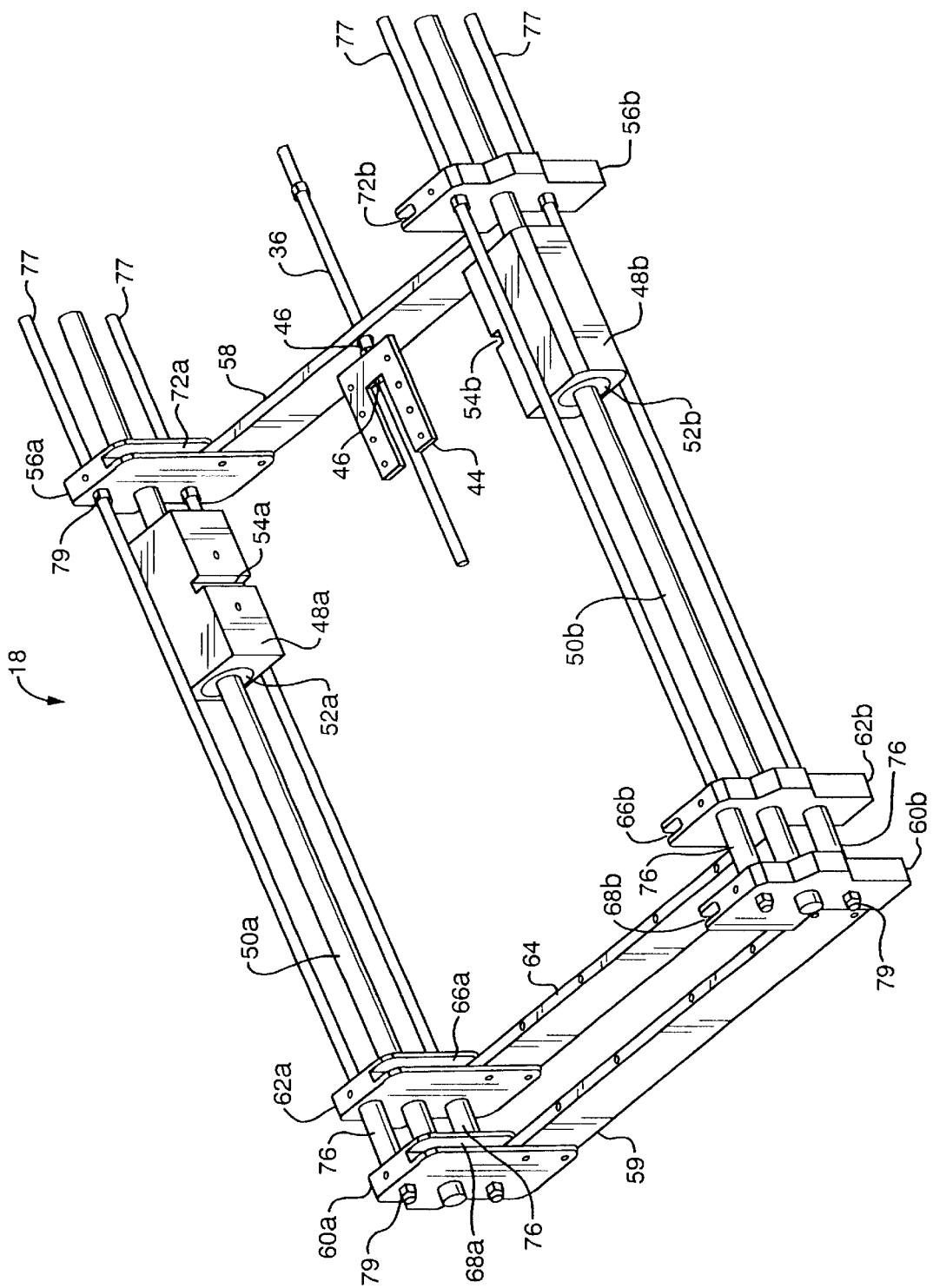
FIG. 5 is a top view showing additional details of the self-aligning coaxial connectors of FIG. 2.

Referring now to the drawings, particularly FIGS. 1–5, there is shown an interface apparatus 10 embodying the present invention that facilitates the interconnection of a device 12 under test with an analyzer 14 and supply 16 for testing the device. As hereinafter described in detail, interface apparatus 10 includes a fixture 18, a pair of interface members 20, 22, and an urging assembly 24. A plurality of self-aligning coaxial connectors 26 are mounted to interface members 20 and 22, the self-aligning coaxial connectors being positioned in substantial alignment with mating connectors 27 on device 12. FIG. 2 shows interface apparatus 10 in its opened position for receiving device 12. FIG. 3 shows interface apparatus 10 in its closed position with the connectors 27 being connected to the self-aligning coaxial connectors 26. Urging assembly 24, which is mounted to a base 28, is provided for moving interface apparatus 10 between its opened and closed positions. In the illustrated embodiment, urging assembly 24 is a pneumatically or hydraulically operated device that is controlled by an operator or is automatically actuated. It is to be understood that, in alternate embodiments, urging assembly 24 is a mechanical device that is controlled by an operator or is automatically actuated. The details of fixture 18, which are best shown in FIGS. 3, 4 and 5, are discussed below.

Referring now to FIGS. 3, 4 and 5, it will be seen that fixture 18 includes a fixed platform 30 that is adapted to receive interface member 20. An index pin 32 is provided for registering interface member 20 relative to fixed platform 30. A slidable platform 34 that is coplanar with fixed platform 30 is operatively connected to urging assembly 24 by means of a rod 36, for example a threaded rod. Slidable platform 34 is adapted to receive interface member 22. An index pin 38 is provided for registering interface member 22 relative to slidable platform 34.

First device guides 40a and 40b, which are adjustable in position on the surface of fixed platform 30 are provided for aligning device 12 with interface member 20. Second device guides 42a and 42b, which are adjustable in position on the surface of slidable platform 34, are provided for aligning device 12 with interface member 22. Device guides 40a, 40b, 42a and 42b provide a rough alignment of the connectors that are mounted on device 12 and self-aligning coaxial connectors 26 that are mounted to interface members 20, 22.

An urging attachment 44 that is fastened to slidable platform 34 is provided for adjustment of the slidable platform 12 relative to urging assembly 24 through the use of fasteners 46, for example nuts, on threaded rod 36. Support blocks 48a and 48b are slidable on guide rails 50a and 50b, respectively. Support blocks 48a and 48b are fitted with rail bearings 52a and 52b, respectively, to facilitate sliding of guide rails 50a and 50b. A locating channel 54a that is formed in support block 48a and a locating channel 54b that is formed in support block 48b are configured to receive interface member 22. A pair of rear end supports 56a and 56b that are held in space relationship by a rear support 58 are configured to receive guide rails 50a and 50b. A pair of front end supports 60a and 60b that are held in space relationship by a front end support 59 are configured to receive guide rails 50a and 50b. A pair of front supports 62a and 62b that are positioned adjacent front end supports 60a and 60b, respectively, are held in space relationship by a front support 64. Guide rails 50a and 50b pass through front supports 62a and 62b. A locating channel 66a that is formed in front support 62a and a locating channel 66b that is formed in front support 62b are configured to receive interface member 20. A locating channel 68a that is formed in front end support 60a and a locating channel 68b that is formed in front support 60b are configured to receive a cable guide 70 (FIG. 2). A locating channel 72a that is formed in rear end support 56a and a locating channel 72b that is formed in rear end support 56b are configured to receive a cable guide 74 (FIG. 2). The geometric relationship of the front end supports 60a,60b and front supports 62a,62b is maintained by means of spacers 76, threaded rod 77 and fasteners 79. Such an arrangement facilitates easy realignment of the supports as may be needed.

Figure 6:
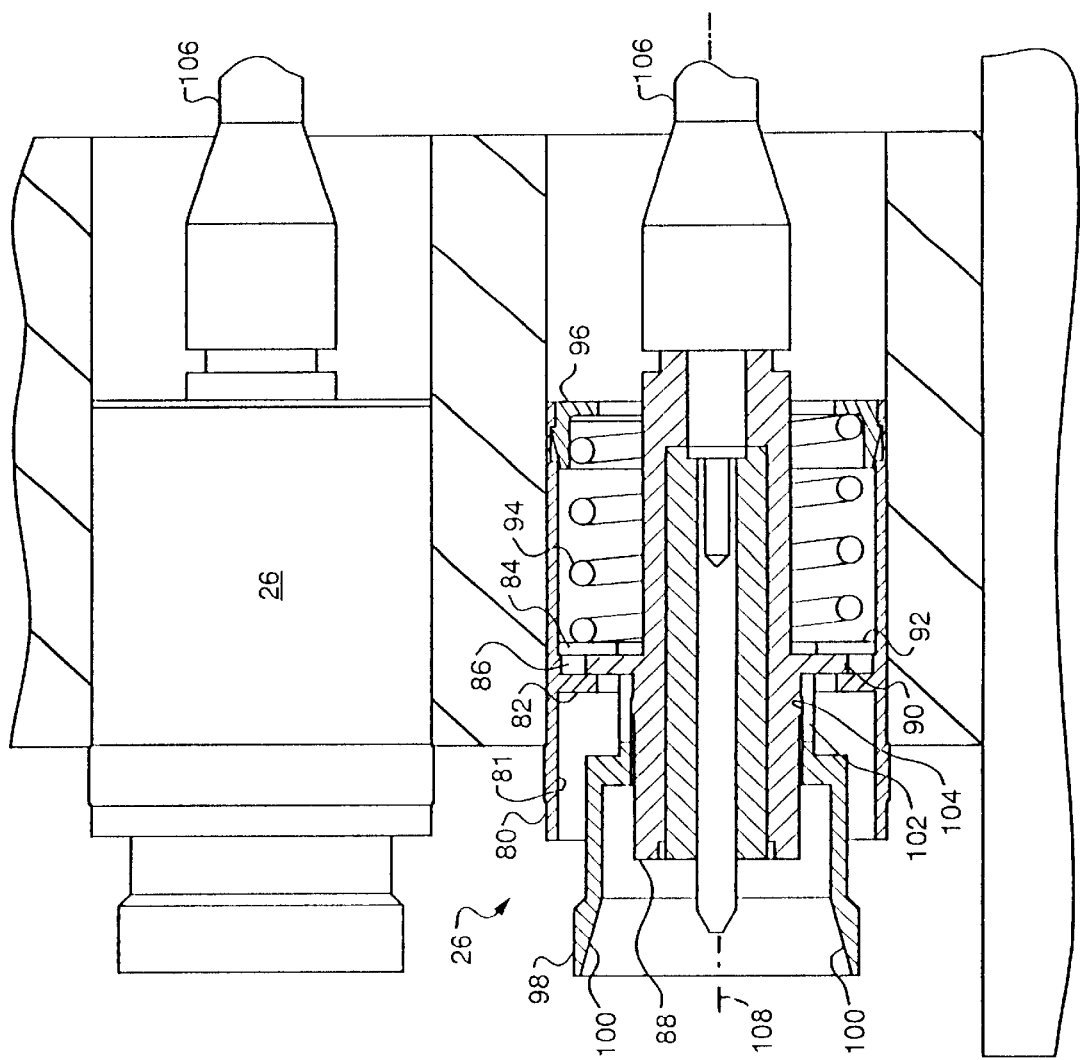
FIG. 6 is a top view showing details of the self-aligning coaxial connector of FIG. 2.
Figure 6:
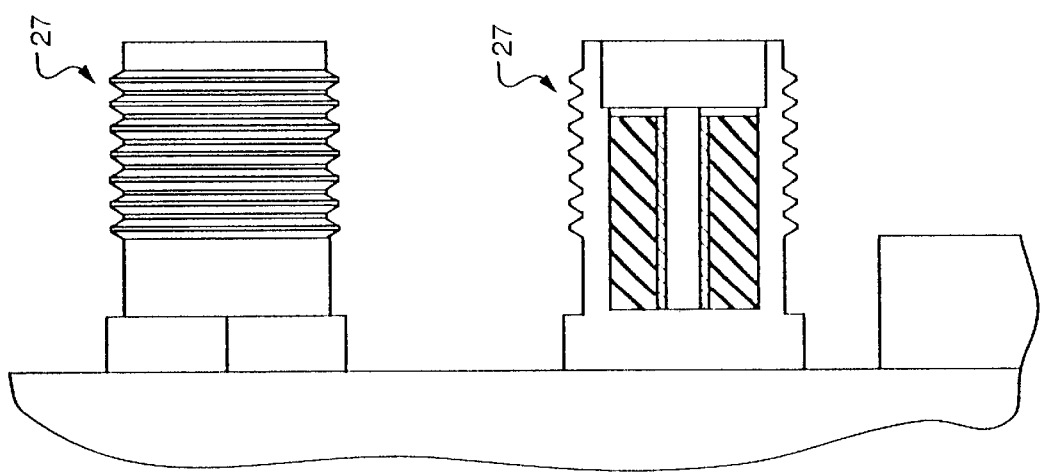

As best shown in FIG. 6, each self-aligning coaxial connector 26 includes a housing 80 that is mounted to interface member 22 and fixed against movement relative thereto. Housing 80 has an internal bore 81, an internal radial flange 82 and an internal radial step 84. The inside diameter of flange 82 is less than the diameter of step 84 and the diameter of step 84 is slightly smaller than the diameter of bore 81. A connector 88 that is inserted from the rear of housing 80 has a radial flange 90. Connector 88 is pushed into housing 80 until connector flange 90 engages housing flange 82. A washer or ring 92 having a diameter that is greater than the inside diameter of step 84 and less than the diameter of bore 81 is inserted from the rear of housing into engagement with step 84, step 84 defining a stop for washer 92. An alignment gap 86 is formed between flange 82 and washer 92. A spring 94, for example, a compression spring, having a diameter that is less than the diameter of bore 81 and greater than the inside diameter of washer 92 is inserted from the rear of housing 80 into engagement washer 92. A retainer 96 is fitted into the rear of housing 80 for retaining spring 94 therein. Retained spring 94 applies a longitudinal or axial spring force against the washer 92.

A coupling collar 98 having an enlarged mouth 100 at a forward end thereof and a plurality of fingers 102 at a rear end thereof is inserted into a front end of housing 80. Enlarged mouth 100 serves as a lead frusto-conical section or cam surface at the forward end of coupling collar 98. Fingers 102 grip raised projections 104 that are provided on connector 88 for captively holding collar 98 to connector 88. A cable 106, for example a coaxial cable, is connected to connector 88.

The longitudinal or axial spring force that is applied by spring 94 against washer 92 urges the washer toward an initial longitudinal position in engagement with step 84. In this manner, connector 88 and its attached coupling collar 98 are resiliently supported within stationary housing 80, in such a manner that connector 88 and collar 98 are provided with freedom of movement in the axial direction relative to stationary housing 80 against the bias of axial spring force.

In addition to movement in the axial direction, connector 88 and collar 98 are movable in an orthogonal direction. Radial flange 90 is provided with a predetermined thickness and diameter, and alignment gap 86 is provided with a predetermined depth and diameter so that there is provided sufficient axial clearance for flange 90 to slide freely in the orthogonal directions between radial flange 82 and washer 92. The predetermined diameters of the radial flange 90 and the alignment gap 86 are such that collar 98 and connector 88 can move a predetermined clearance distance in any orthogonal direction. This construction thereby serves to effectively confine radial flange 90 within alignment gap 86, while enabling connector 88 freedom of substantially unrestricted orthogonal movement relative to a longitudinal axis 108 of housing 80, within a predetermined range of movement defined by alignment gap 86.

From the foregoing, it will be realized that collar 98 and connector 88 are permitted to tilt or cant against the bias of spring force to a position in which theoretical centerline of collar 98 and connector 88 is disposed at an oblique angle with respect to an actual centerline of bore 81 of housing 80. Accordingly, the present invention thus effectively provides collar 98 and connector 88 with freedom of movement in substantially any direction for movement as a "free body" relative to stationary housing 80 in order to facilitate mating engagement while nominally eliminating application of stress or potential energy on connector components in the orthogonal direction. This will become more apparent with respect to the operation of the present invention discussed hereinafter.

In a first step in the operation of the present invention, interface apparatus 10 is placed in its opened position shown in FIG. 2. Next, device 12 is placed on platforms 30 and 34. It is to be understood that the self-aligning coaxial connectors 26 on interface members 20 and 22 are generally in general alignment with the connectors 27 on device 12. Next, urging assembly 24 is activated to move interface apparatus into its closed position shown in FIG. 3. Assuming misalignment between connector 27 and self-aligning coaxial connectors 26, continued movement of connector 26 into initial mating engagement with connectors 27 serves to engage lead frusto-conical section or cam surface 100 with external diameter connector 27. This engagement serves to initiate camming action or self-acting deflection of the coupling collar 98 and connector 88 into coaxial alignment with connector 27. During this mating movement, the spring force applied by spring 94 against washer 92 generally maintains coupling collar 98 in its initial longitudinal position relative to bore 81 and offers no impediment to the radial translation and alignment of the connector 88. Accordingly, as discussed herein above, the radial translation or orthogonal movement takes place nominally without generating any orthogonal stress or potential energy, or otherwise deforming or preloading of connectors 88 or connectors 27. This feature advantageously provides for improved performance and reduced wear relative to prior constructions. Continued mating movement of interface member 22 toward device 12 will bring self-aligning coaxial connectors 26 into coplanar engagement with connector 27. The continued mating movement of interface member 22 toward device 12 serves to deflect coupling collar 98 and connector 88 relative to bore 81 against the bias of the spring force applied by spring 94. The spring force bears directly upon contact faces of connectors 27 and connector 88 to help ensure that the connectors are electrically unified. This deflection also serves to advantageously compensate for longitudinal tolerances in connectors 88 and 27. Connectors 88 and 27 thus reach a fully mated position after occurrence of such deflection.

Figure 7:
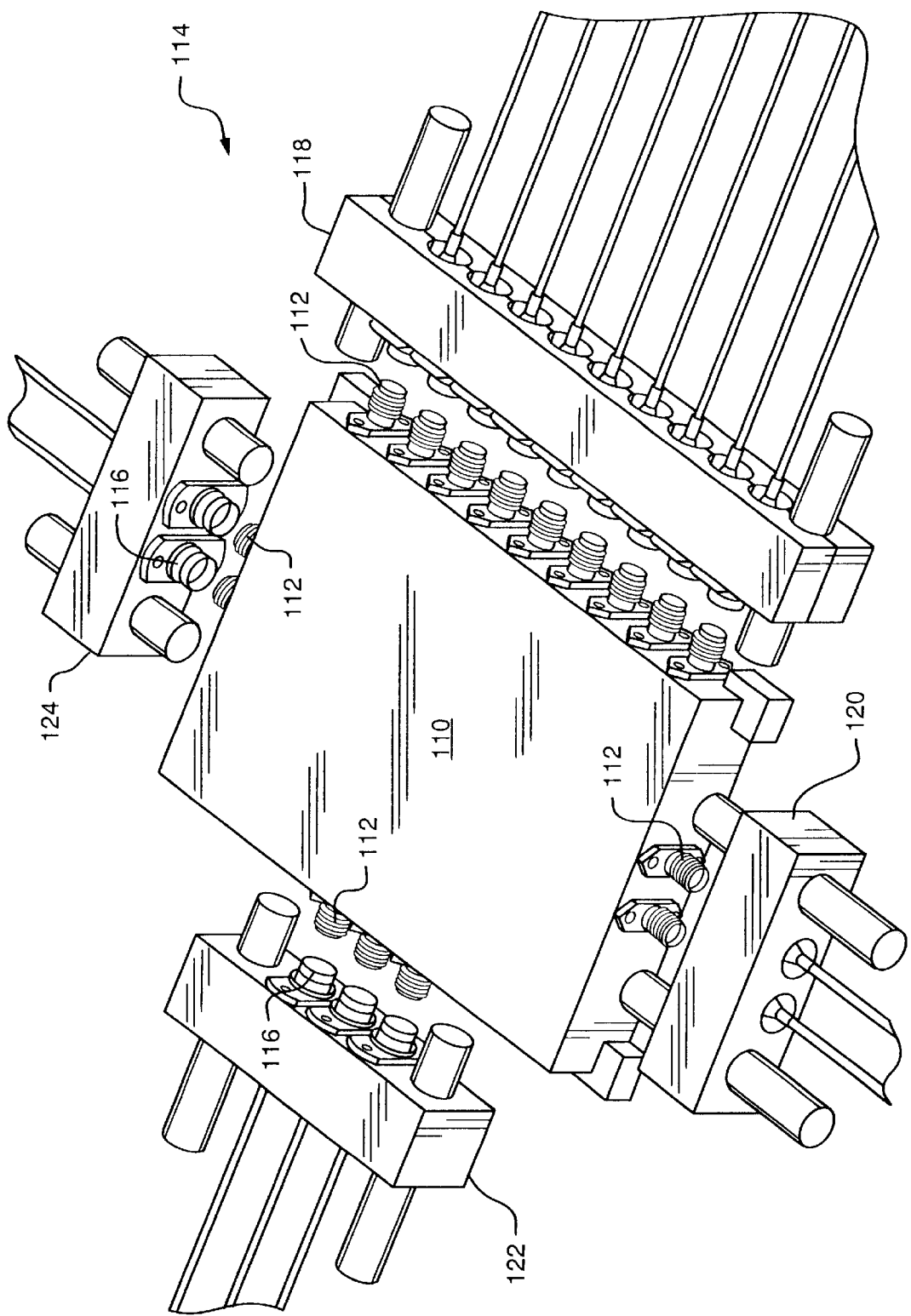
FIG. 7 is a perspective view of an alternate embodiment of the interface apparatus in an open position, the interface apparatus having a plurality of rectangularly disposed self-aligning coaxial connectors, a device to be tested being positioned in the interface apparatus.

In the embodiment shown in FIGS. 2 and 3, connectors 27 are mounted on opposite parallel sides of device 12. Accordingly, interface members 20 and 22 are in parallel alignment, interface member 20 being stationary and interface member 20 being slidable. In an alternate embodiment shown in FIG. 7, a device 110 to be tested has a plurality of connectors 112 on four sides. In this embodiment, an interface apparatus 114 has a plurality of self-aligning coaxial connectors 116 that are mounted on interface members 118, 120, 122 and 124. Interface apparatus 114 is substantially identical in construction and operation to interface apparatus 10. However, in the embodiment of FIG. 7, all or selected ones of interface members 118, 120, 122 and 124 are movable relative to device 110 by means of urging assemblies, each of which is substantially identical to urging assembly 24 shown in FIG. 2 for interconnection of self-aligning coaxial connectors 116 and connectors 112.

Thus, the subject invention presents a means of accomplishing mechanical blind mating at relatively low cost, without compromise to RF performance by employing a relatively simple construction using many traditional RF components and eliminating the need for relatively high manufacturing tolerances. Further, this invention presents a means of connection in which freedom of movement in an orthogonal direction is provided to compensate for any misalignment while nominally preventing the generation of any orthogonal preload or stress within the connectors.

Since certain changes may be made in the foregoing disclosure without departing from the scope of the invention herein involved, it is intended that all matter contained in the above description and depicted in the accompanying drawings be construed in an illustrative and not a limiting sense.

What is claimed is:

1. A self-aligning interface apparatus for interconnecting a device under test with an analyzer and supply for testing the device, said apparatus comprising:

a) a fixture adapted to receive a device to be tested, the device to be tested having a plurality of connectors;

b) interface means slidably mounted to said fixture, said interface means constrained for slidable movement relative to the device to be tested that is positioned in said fixture;

c) a plurality of self-aligning coaxial connectors operatively connected to said interface means in substantial alignment with the connectors of the device to be tested that is positioned in said fixture, one of each said plurality of self-aligning coaxial connectors positioned to be moved into mating engagement with one of each of the connectors of the device to be tested that is positioned in said fixture; and d) urging means operatively connected to said interface means for moving said interface means, said self-aligning coaxial connectors operatively connected to said interface means being simultaneously moved into mating engagement with selected ones of the connectors of the device to be tested positioned in said fixture when said interface means is moved by said urging means, said self-aligning coaxial connectors and the connectors of the device to be tested are electrically and mechanically connected to one another when in mating engagement, whereby said apparatus is a self-aligning interface apparatus.

2. The self-aligning interface apparatus for use in testing a device to be tested as claimed in claim 1 wherein each said self-aligning coaxial connector includes:

a) a coupling member adapted to receive a coaxial cable and configured to selectively engage one of the connectors of the device to be tested positioned in said fixture for electrically coupling the coaxial cable with one of the connectors of the device to be tested by means of the interconnection of said coupling member of said self-aligning coaxial connector and the connector of the device to be tested, one of the connector of the device to be tested being in substantial coaxial alignment with one of said self-aligning coaxial connectors;

b) a housing adapted to movably support said coupling member, said coupling member being restrained for substantially unrestricted movement within a predetermined range of movement in a substantially orthogonal direction relative to a longitudinal axis of said housing into coaxial alignment with one of the connectors of the device to be tested to facilitate the engagement of said self-aligning coaxial connector and the connectors of the device to be tested that is positioned in said fixture; and c) an urging means adapted to resiliently urge said coupling member toward engagement of said self-aligning coaxial connector and the connector of the device to be tested that is positioned in said fixture.

3. The self-aligning interface apparatus for use in testing a device to be tested as claimed in claim 2 wherein said coupling member is adapted for movement relative to said housing in a direction that is orthogonal to said longitudinal axis of said housing, said coupling member moving between an initial disengaged position and a final engaged position in which said coupling member is fully engaged with the connector of the device to be tested that is positioned in said fixture, said urging means urging said coupling member toward engagement with the connector of the device to be tested by moving said coupling member from said initial position to said final engaged position.

4. A self-aligning interface apparatus for use in testing a device to be tested, said apparatus comprising:
   a) a fixture adapted to receive a device to be tested, the device to be tested having a plurality of connectors;
   b) interface means slidably mounted to said fixture, said interface means constrained for slidable movement relative to the device to be tested that is positioned in said fixture;
   c) a plurality of self-aligning coaxial connectors operatively connected to said interface means in substantial alignment with the connectors of the device to be tested that is positioned in said fixture, one of each said plurality of self-aligning coaxial connectors positioned to be moved into mating engagement with one of each of the connectors of the device to be tested that is positioned in said fixture, each said self-aligning coaxial connector including a coupling member and a housing, said coupling member including a connector member that is adapted to receive a cable and to matingly engage one of each of the connectors of the device to be tested that is positioned in said fixture for electrically coupling the cable in with the connector of the device to be tested in substantial alignment therewith, said housing adapted to movably support said coupling member, wherein said coupling member is adapted for movement in substantially any direction relative to the connector of the device to be tested in substantial alignment therewith to facilitate the mating engagement; and
   d) urging means operatively connected to said interface means for moving said interface means, said self-aligning coaxial connectors operatively connected to said interface means being simultaneously moved into mating engagement with selected ones of the connectors of the device to be tested positioned in said fixture, said self-aligning coaxial connectors and the connectors of the device to be tested are electrically and mechanically connected to one another when in mating engagement, whereby said apparatus is a self-aligning interface apparatus.

5. The self-aligning interface apparatus for use in testing a device to be tested as claimed in claim 4 wherein said interface means includes a first interface means and a second interface means, at least one of said self-aligning coaxial connectors operatively connected to said first interface means and at least another one of said self-aligning coaxial connectors operatively connected to said second interface means.

6. The self-aligning interface apparatus for use in testing a device to be tested as claimed in claim 5 wherein said first interface means is mounted to one side of said fixture and said second interface means is mounted to another side of said fixture.

7. The self-aligning interface apparatus for use in testing a device to be tested as claimed in claim 6 wherein said urging means includes first urging means and second urging means operatively connected to said interface means, said first urging means configured to move said first interface means and each said self-aligning coaxial connector operatively connected thereto into substantially simultaneous engagement with selected ones of the connectors of the device to be tested in substantial alignment therewith, said second urging means configured to move said second interface means of each said self-aligning coaxial connector operatively connected thereto into substantially simultaneous engagement with selected ones of the connectors of the device to be tested in substantial alignment therewith.

8. The self-aligning interface apparatus for use in testing a device to be tested as claimed in claim 4 wherein each said self-aligning coaxial connector includes biasing means operatively associated with said coupling member, said biasing means providing a force that results in said coupling member resisting movement in a direction that is oblique relative to said longitudinal axis and in a direction that is parallel to said longitudinal axis while facilitating substantially unrestricted movement in a direction that is substantially orthogonal to said longitudinal axis.

9. A self-aligning interface apparatus for use in testing a device to be tested, said apparatus comprising:
   a) a fixture having first and second sides, said fixture adapted to receive a device to be tested, the device to be tested having a first side and a second side, a plurality of connectors on the first and second sides of the device to be tested;
   b) interface means slidably mounted to said first and second sides of said fixture, said interface means constrained for slidable movement in a first direction toward the first side of the device to be tested that is positioned in said fixture and in a second direction toward the second side of the device to be tested that is positioned in said fixture;
   c) a plurality of self-aligning coaxial connectors operatively connected to said interface means in substantial alignment with the connectors of the device to be tested that is positioned in said fixture, one of each said plurality of self-aligning coaxial connectors positioned to be moved into mating engagement with one of each of the connectors of the device to be tested that is positioned in said fixture, selected ones of said self-aligning coaxial connector being disposed in substantial alignment with the connectors on the first side of the device to be tested and other selected other ones of said self-aligning coaxial connector being disposed in substantial alignment with the connectors on the second side of the device to be tested; and
   d) urging means operatively connected to said interface means for moving said interface means in said first and second directions, said self-aligning coaxial connectors operatively connected to said interface means being simultaneously moved into mating engagement with selected ones of the connectors of the device to be tested positioned in said fixture, said interface means moved in said first direction simultaneously urging said selected ones of said self-aligning coaxial connectors in said first direction into mating engagement with selected ones of the connectors of the device to be tested that are positioned in substantial alignment with said selected ones of said self-aligning coaxial connectors, said interface means moved in said second direction simultaneously urging said selected other ones of said self-aligning coaxial connectors in said second direction into mating engagement with selected ones of the connectors of the device to be tested that are positioned in substantial alignment with said selected other ones of said self-aligning coaxial connectors, said self-aligning coaxial connectors and the connectors of the device to be tested being electrically and mechanically connected to one another when in mating engagement, whereby said apparatus is a self-aligning interface apparatus.

10. The self-aligning interface apparatus for use in testing a device to be tested as claimed in claim 9 wherein each said self-aligning coaxial connector includes:
 a) a connector member that is adapted to receive a cable;
 b) a coupling collar operatively connected to said connector member;
 c) a housing mounted to said interface means, said housing adapted to retain and support said connector member, wherein said connector member and said coupling collar are constrained for movement in substantially any direction relative to a longitudinal axis of said housing; and
 d) biasing means operatively associated with said connector member, said biasing means providing a force that results in said connector member and said coupling cooler resisting movement in a direction that is oblique relative to said longitudinal axis and in a direction that is parallel to said longitudinal axis while facilitating substantially unrestricted movement in a direction substantially orthogonal to said longitudinal axis.

11. An interface apparatus for substantially simultaneous interconnection with a plurality of connectors on a unit under test, said apparatus comprising:
 a) a base member;
 b) a first interface means mounted to said base;
 c) a second interface means mounted to said base, said first and second interface means being spaced apart to receive the unit under test;
 d) at least one of said first and second interface means mounted for slidable movement on said base relative to said other of said first and second interface means for movement into engagement and disengagement with the unit under test that is positioned between said first and second interface means;
 e) a plurality of self-aligning coaxial connectors mounted to at least one of said first and second interface means, said self-aligning coaxial connectors are positioned to interconnect with the plurality of connectors on the unit under test;
 f) urging means operatively connected to said movable one of said first and second interface means for moving said movable one of said first and second interface means toward the unit under test for mating engagement of said self-aligning coaxial connectors and the connectors of the unit under test, whereby said apparatus is a self-aligning interface apparatus.

12. A self-aligning coaxial connector comprising:
 a) a connector member that is adapted to receive a coaxial cable;
 b) a coupling collar operatively connected to said connector member;
 c) a housing adapted to receive said connector member, said connector member and said coupling collar being coaxially constrained within said housing for movement in substantially any direction relative to said housing; and
 d) biasing means operatively associated with said connector member, said biasing means providing a force that results in said connector member and said coupling collar resisting movement in a direction that is oblique relative to a longitudinal axis of said housing and in a direction that is parallel to the longitudinal axis of said housing while facilitating substantially unrestricted movement in a direction substantially orthogonal to the longitudinal axis of said housing, whereby said coaxial connector is self-aligning.

13. The self-aligning coaxial connector as claimed in claim 12 wherein said housing is formed with an internal bore, an internal radial flange and an internal radial step, an inside diameter of said radial flange being less than an inside diameter of said radial step, said inside diameter of said step being smaller than an inside diameter of said bore.

14. The self-aligning coaxial connector as claimed in claim 13 including a washer means having an outside diameter and an inside diameter, said outside diameter of said washer being greater than said inside diameter of said step and less than said inside diameter of said bore, said step defining a stop for said washer means, said biasing means pressing against said washer means.

15. The self-aligning coaxial connector as claimed in claim 14 wherein said connector member has a radial flange having an outside diameter that is less than said inside diameter of said bore and greater than said inside diameters of said housing internal radial flange and said inside diameter of said washer means.

16. The self-aligning coaxial connector as claimed in claim 15 including retainer means operatively connected to said housing for retaining said biasing means in said housing in pressing engagement with said washer means.

17. A self-aligning interface apparatus for interconnection of a first electrical device having a plurality of connectors with a second electrical device, said apparatus comprising:
 a) a fixture adapted to receive the first electrical device;
 b) interface means operatively connected to said fixture, said interface means and said fixture constrained for relative slidable movement;
 c) a plurality of self-aligning coaxial connectors operatively connected to said interface means in substantial alignment with the connectors of the first electrical device received in said fixture, said plurality of self-aligning coaxial connectors positioned to be moved into mating engagement with the connectors of the first electrical device received in said fixture; and
 d) a plurality of cable means connected to said self-aligning coaxial connectors, said cable means configured to be connected to the second electrical device;
 e) said self-aligning coaxial connectors being moved into mating engagement with selected ones of the connectors of the first electrical device received in said fixture by relative slidable movement of said interface means and said fixture, said self-aligning coaxial connectors and the connectors of the first electrical device received in said fixture being electrically and mechanically connected to one another when in mating engagement, whereby the first and second electrical devices are electrically connected when said cable means are connected to the second electrical device and said self-aligning coaxial connectors are in mating engagement with the connectors of the first electrical device, whereby said apparatus is a self-aligning interface apparatus.

* * * * *

UNITED STATES PATENT AND TRADEMARK OFFICE
CERTIFICATE OF CORRECTION

PATENT NO. : 6,344,736 B1
DATED : February 5, 2002
INVENTOR(S) : James J. Kerrigan and Frank Kendall Porter, Jr.

It is certified that error appears in the above-identified patent and that said Letters Patent is hereby corrected as shown below:

<u>Title page, Item [54] and Column 1, lines 1-2,</u>
Title, replace "SELF-ALIGNING INTERFACE APPARATUS FOR USE IN TESTING ELECTRICAL" with -- SELF-ALIGNING INTERFACE APPARATUS FOR USE IN TESTING ELECTRICAL DEVICES --.

Signed and Sealed this

Thirtieth Day of July, 2002

*Attest:*

*Attesting Officer*

JAMES E. ROGAN
*Director of the United States Patent and Trademark Office*